United States Patent [19]
Phillips

[11] 4,422,755
[45] Dec. 27, 1983

[54] FRONTAL ILLUMINATION SYSTEM FOR SEMICONDUCTIVE WAFERS

[75] Inventor: Edward H. Phillips, Middletown, Calif.

[73] Assignee: Optimetrix Corporation, Mountain View, Calif.

[21] Appl. No.: 388,147

[22] Filed: Jun. 14, 1982

Related U.S. Application Data

[63] Continuation of Ser. No. 113,375, Jan. 18, 1980, abandoned.

[51] Int. Cl.³ .................. G03B 27/52; G03B 27/70
[52] U.S. Cl. ................................ 355/43; 355/1; 355/45
[58] Field of Search .............. 355/43, 45, 52, 53, 355/54, 1, 72; 356/168

[56] References Cited

U.S. PATENT DOCUMENTS

| | | | |
|---|---|---|---|
| 3,610,750 | 10/1971 | Lewis et al. | 355/43 |
| 3,963,353 | 6/1976 | Hemstreet | 356/168 |
| 3,984,186 | 10/1976 | Momose et al. | 355/45 |
| 4,068,947 | 1/1978 | Buckley et al. | 355/72 |

FOREIGN PATENT DOCUMENTS

| 17759 | 10/1980 | European Pat. Off. |
|---|---|---|
| 2128822 | 10/1972 | France |

Primary Examiner—Richard A. Wintercorn
Attorney, Agent, or Firm—Roland I. Griffin

[57] ABSTRACT

A projection lens is disposed directly above a vacuum chuck for projecting an image of an illuminated portion of a semiconductive wafer held thereby to an image plane where that image may be viewed through a pair of objective lenses of a compound microscope. Microcircuitry contained on a reticle held by a holder positioned above the projection lens is photometrically printed onto the semiconductive wafer by passing exposure light through the reticle and the projection lens to the semiconductive wafer. At least one fiber optic source of illuminating light and one or more optical lenses are employed for projecting an image of the fiber optic light source through the objective lens to an entrance pupil of the projection lens without passing through the reticle to provide uniform illumination of the semiconductive wafer and facilitate direct wafer alignment prior to photometrically printing on the semiconductive wafer.

19 Claims, 6 Drawing Figures

FRONTAL ILLUMINATION SYSTEM FOR SEMICONDUCTIVE WAFERS

CROSS REFERENCE TO RELATED APPLICATION

This is a continuation of application Ser. No. 113,375, filed Jan. 18, 1980, now abandoned.

BACKGROUND AND SUMMARY OF THE INVENTION

This invention relates generally to illumination systems for use in alignment and exposure apparatus to illuminate a semiconductive wafer to be aligned with a photomask or a reticle, and, more particularly, to an improved illumination system for use in alignment and exposure apparatus utilizing a projection lens.

In conventional illumination systems for use in alignment and exposure apparatus, the semiconductive wafer is typically illuminated by nonexposure light first passing through the photomask or reticle. This does not uniformly illuminate the semiconductive wafer and does not permit viewing of the illuminated wafer independently of the photomask or reticle without removing the photomask or reticle from the alignment and exposure apparatus. In most projection alignment and exposure apparatus of the type utilizing a projection lens there is no provision for directly viewing a semiconductive wafer through the projection lens, and there is, therefore, no illumination system. This precludes direct wafer alignment and thereby reduces the alignment accuracy of the images photometrically printed by the projection alignment and exposure apparatus. In one projection alignment and exposure apparatus utilizing a projection lens, an illumination system has been employed for illuminating only a portion of the viewed field. In is not possible, however, in this illumination system to move the illuminated portion of the viewed field so as to permit illumination with nonexposure light of all portions of the viewed field as may be desired.

Accordingly, it is the principal object of this invention to provide an improved illumination system for use in projection alignment and exposure apparatus to uniformly illuminate the entire field viewed on the semiconductive wafer by a microscope through a projection lens without passing the illuminating light through the photomask or the reticle and without illuminating the entire semiconductive wafer.

This and other objects, which will become apparent from an inspection of the accompanying drawings and a reading of the associated description, are accomplished according to the illustrated preferred embodiments of this invention by employing a projection lens fixedly mounted to project an image of an illuminated portion of a semiconductive wafer positioned in a first image plane to a second image plane; by employing a compound microscope having a pair of split-field objective lenses movably mounted to view the projected image in the second image plane; and by employing for each of those objective lenses a separate associated fiber optic light source mounted for movement with the objective lens to project a beam of nominally uniform nonexposure light towards the objective lens, and one or more separate associated optical lenses also mounted for movement with the objective lens so that there is projected through the objective lens to the entrance pupil of the projection lens an image of the associated fiber optic light source that is large enough to completely fill the entrance pupil of the projection lens for any position to which the objective lens may be moved.

Alternatively, a single stationary fiber optic light source and one or more stationary optical lenses may be employed for both objective lenses. This may be accomplished by employing a fiber optic light source fixedly mounted to project a beam of nominally uniform nonexposure light along a fixed portion of the optical path of the compound microscope towards a split-field prism associated with both objective lenses; and by employing one or more optical lenses fixedly mounted so that there is projected to the split-field prism and thence through both objective lenses to the entrance pupil of the projection lens an image of the fiber optic light source that is large enough to completely fill the entrance pupil of the projection lens for any position to which the objective lenses may be move.

DESCRIPTION OF THE PREFERRED EMBODIMENTS

Figure 1:
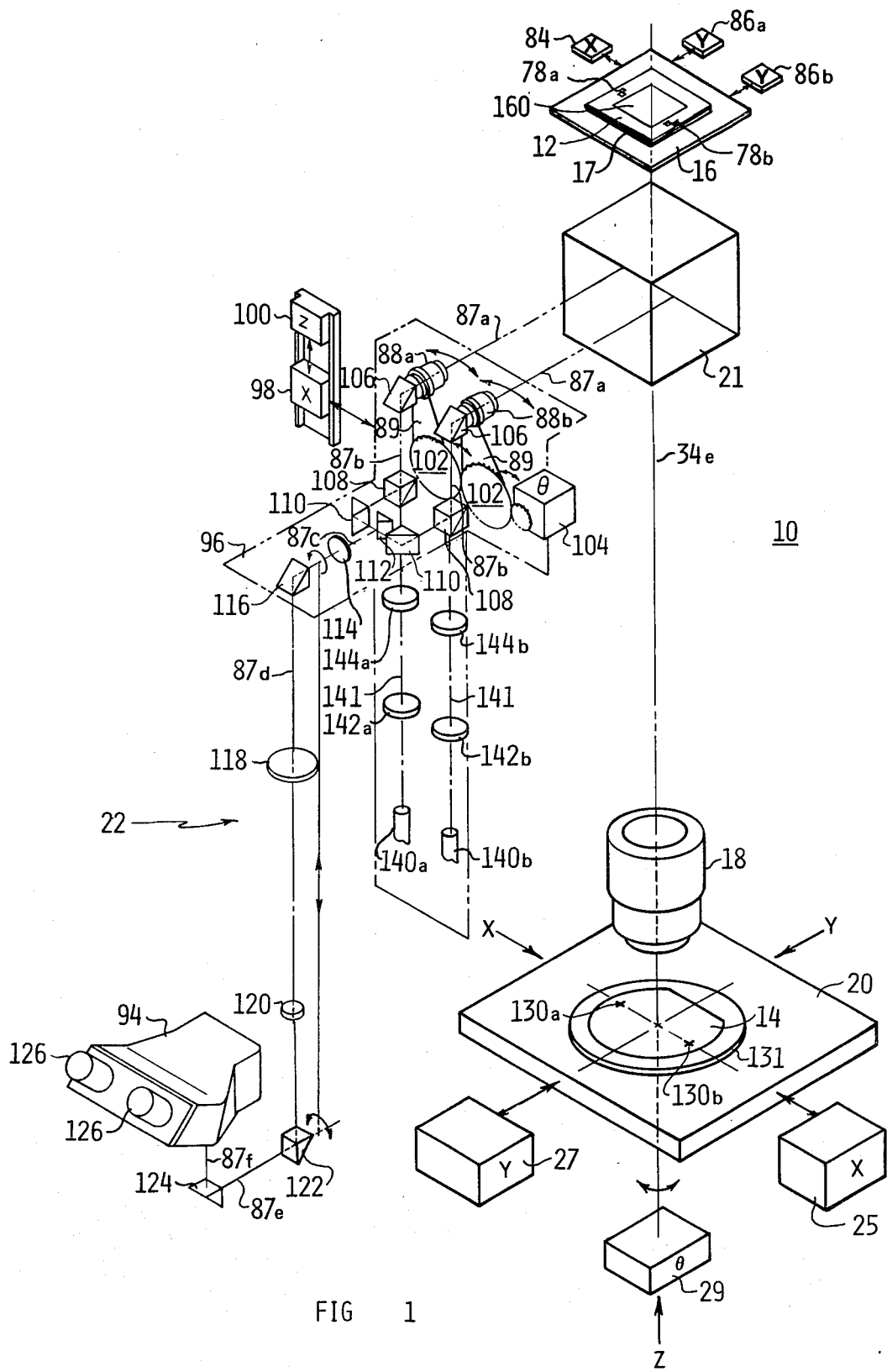
FIG. 1 is a perspective view of a portion of a step-and-repeat projection alignment and exposure apparatus incorporating an illumination system according to a preferred embodiment of this invention.
Figure 2:
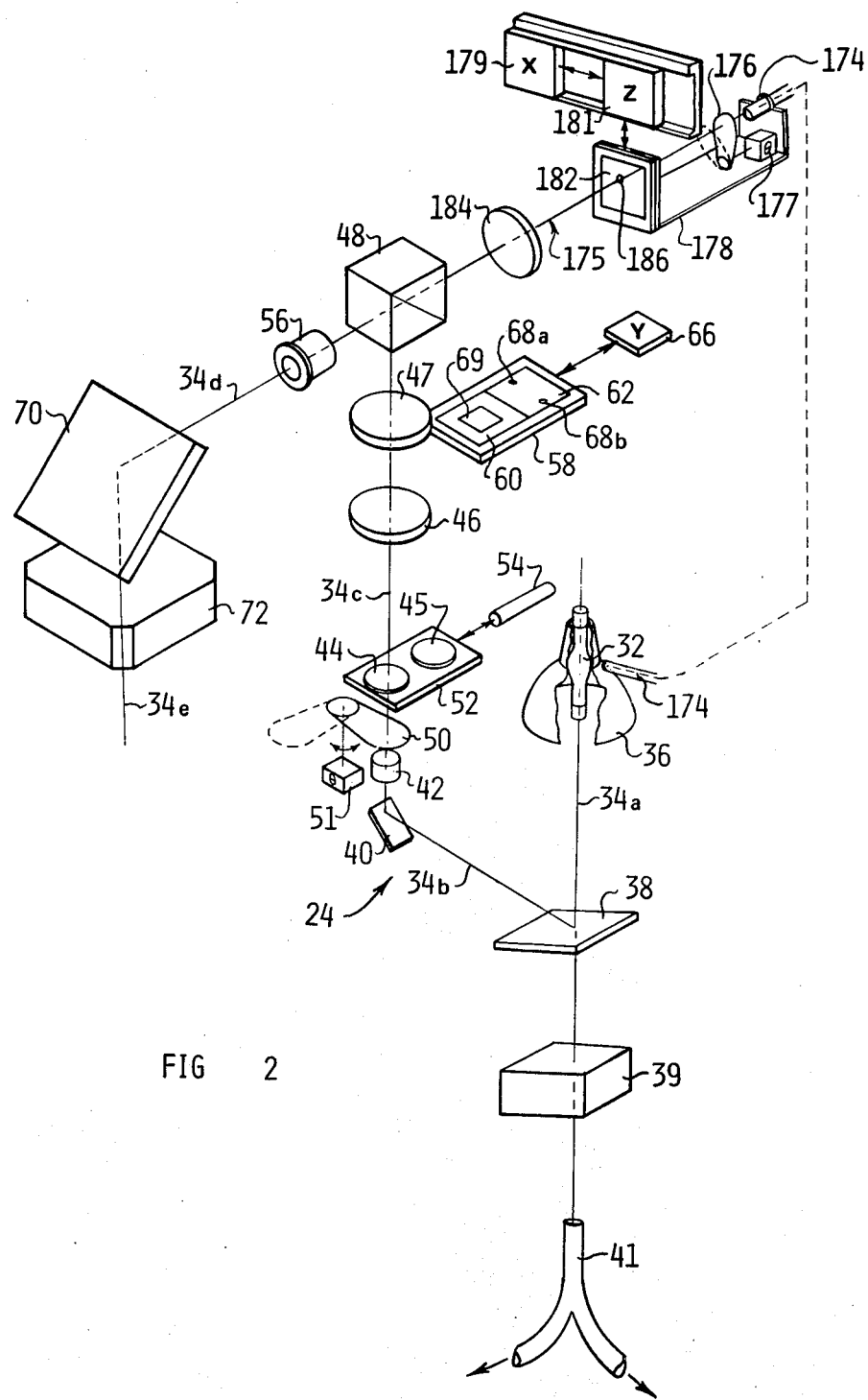
FIG. 2 is a perspective view of another portion of the step-and-repeat projection alignment and exposure apparatus of FIG. 1 illustrating the source of illumination and exposure light for the apparatus.
Figure 3:
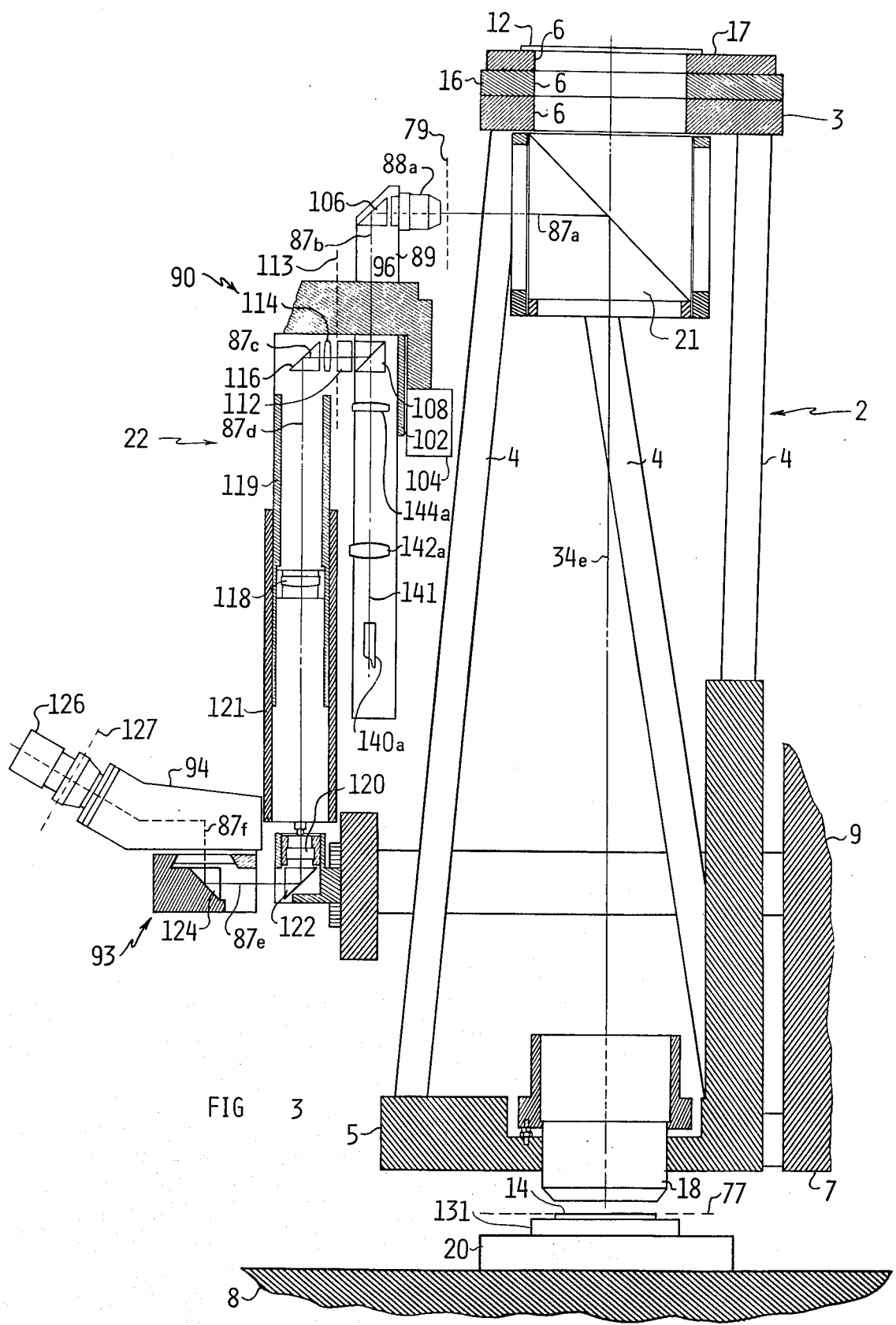
FIG. 3 is a half-sectional elevational view of the portion of the step-and-repeat alignment and exposure apparatus incorporating the illumination system of the preferred embodiment of this invention as shown in FIG. 1.

Referring now to FIGS. 1, 2 and 3, there is shown a precision step-and-repeat alignment and exposure system 10 for repeatedly printing one level of microcircuitry, contained on a first object, such as a reticle 12, at an array of adjacent regions of a second object, such as a semiconductive wafer 14, in alignment with other levels of microcircuitry previously printed or yet to be printed at those same regions. Alignment and exposure system 10 includes a stage 16 for holding the reticle 12, a 10:1 projection lens 18 for projecting an image of illuminated portions of the reticle onto the semiconductive wafer 14, a main stage 20 for positioning the semiconductive wafer with respect to the projected image of the illuminated portions of the reticle, a beam splitter 21 and a compound microscope 22 for viewing aerial images of portions of the semiconductive wafer illuminated by the projected image of the reticle, and a light source unit 24 for selectively illuminating different portions of the reticle and/or the semiconductive wafer during alignment operations and for selectively exposing a photosensitive film on the semiconductive wafer during step-and-repeat printing operations.

With reference now particularly to FIG. 1, main stage 20 may comprise an interferometrically-controlled stage of the type shown and described in detail in copending U.S. patent application Ser. No. 015,713 entitled INTERFEROMETRICALLY CONTROLLED STAGE WITH PRECISELY ORTHOGONAL AXES OF MOTION, filed on Feb. 27, 1979, by Edward H. Phillips, assigned to the same assignee as the present application, and incorporated by reference herein (U.S. patent application Ser. No. 015,713 has been abandoned in favor of continuation U.S. patent application Ser. No. 198,358, filed on Oct. 20, 1980, and issued as U.S. Pat. No. 4,311,390 on Jan. 19, 1982). As fully described in that application, main stage 20 may be moved along orthogonal X and Y axes to any position in a horizontal plane by X and Y axes servo drive units 25 and 27. The semiconductive wafer 14 is held by a vacuum chuck 131 mounted on main stage 20 for differential movement with respect to the plane of the main stage to permit parallel-plane alignment and focusing of the upper surface of the semiconductive wafer in a first image plane 77 (see FIG. 3) as described in detail in copending U.S. patent application Ser. No. 025,917, entitled OPTICAL FOCUSING SYSTEM, filed on Apr. 2, 1979, by Edward H. Phillips, assigned to the same assignee as the present application, and incorporated by reference herein (U.S. patent application Ser. No. 025,917 has been abandoned in favor of continuation U.S. patent application Ser. No. 183,402, filed on Sept. 2, 1980, and issued as U.S. Pat. No. 4,383,757 on May 17, 1983). Vacuum chuck 131 may be rotated about a Z axis orthogonal to the X and Y axes by a $\theta$ servo drive unit 29.

With reference now particularly to FIG. 2, light source unit 24 includes a mercury arc lamp 32 for emitting a spectrum of light energy including both green illuminating light having a wave length of about 547 nanometers for illuminating but not exposing the photosensitive film on semiconductive wafer 14 (herein simply referred to as illuminating light), and blue illuminating and exposure light having a wavelength of about 436 nonometers for both illuminating and exposing the photosensitive film on the semiconductive wafer (herein simply referred to as exposure light). Mercury arc lamp 32 is fixedly mounted along a vertically extending portion 34a of an optical path 34a-e of alignment and exposure system 10. An elliptical reflector 36 surrounds mercury arc lamp 32 and is fixedly coaxially mounted therewith for projecting a beam of light emitter by the mercury arc lamp downward to a partially transmissive plane mirror 38 for reflecting the blue exposure light and fifty percent of the green illuminating light while transmitting fifty percent of the green illuminating light.

A band pass filter 39 is fixedly mounted in the optical path of the light transmitted by partially transmissive plane mirror 38 to pass the transmitted green illuminating light to a bifurcated fiber optic light pipe 41 while filtering out all other light. Partially transmissive plane mirror 38 is fixedly mounted in optical path 34a-e at an angle of forty-five degrees with respect to the vertically extending portion 34a thereof so as to deflect the reflected blue and green light in the beam of light along a horizontally extending portion 34b of that optical path to a plane mirror 40. This plane mirror 40 has a multilayer dielectric coating for reflecting blue and green light while transmitting all other light to prevent unnecessary energy from being transmitted along the remaining portions of optical path 34a-e.

Plane mirror 40 is fixedly mounted in optical path 34a-e at an angle of forty-five degrees with respect to the horizontally extending portion 34b thereof so as to deflect the beam of blue and green light incident thereon upward along another vertically extending portion 34c of that optical path. The beam of light so deflected thereupon passes through a light integrator 42 and, when a normally closed shutter 50 is opened, also through a blue or a green filter 44 or 45 and a pair of positive lenses 46 and 47 to a beam splitter 48. Light integrator 42 is fixedly mounted in the vertically extending portion 34c of optical path 34a-e and is employed for providing the beam of light passing therethrough with a cross section corresponding to the entrance pupil of projection lens 18 and with a uniform intensity distribution in the plane of reticle 12 (see FIG. 1).

The shutter 50 is pivotally mounted adjacent to the vertically extending portion 34c of optical path 34a-e and is controlled by a $\theta$ servo drive unit 51 for pivotal movement into that optical path (as shown in solid lines) when closed so as to block passage of the beam of light therealong and for pivotal movement out of that optical path (as shown in dashed lines) when opened so as to permit passage of the beam of light therealong. Shutter 50 may be constructed and operated as shown and described in detail in copending U.S. patent applications Ser. Nos. 082,484 and 082,485, both entitled IMPROVED SHUTTER MECHANISM, filed on Oct. 9, 1979, by Edward H. Phillips and Lawrence A. Wise, respectively, assigned to the same assignee as the present application, and incorporated by reference herein (U.S. patent application Ser. No. 082,484 issued as U.S. Pat. No. 4,350,428 on Sept. 21, 1982, and U.S. patent application Ser. No. 082,485 issued as U.S. Pat. No. 4,355,272 on Oct. 19, 1982). Blue filter 44 and green filter 45 are fixedly mounted in horizontally spaced relationship on a slide 52 which is in turn reciprocally mounted in a horizontal plane orthogonally intersecting the vertically extending portion 34c of optical path 34a-e. Slide 52 is moved along the Y axis under control of an air cylinder 54 to position either the blue filter 44 or the green filter 45 in the path of the beam of blue and green light passing upward along the vertically extending portion 34c of optical path 34a-e when shutter 50 is opened. Blue filter 44 is normally so positioned and therefore passes the blue exposure light in the beam of light to the pair of positive lenses 46 and 47 while filtering out the green illuminating light and any other non-blue light that may still be present in the beam of light.

With reference now to FIGS. 1 and 2, positive lenses 46 and 47 are fixedly mounted in the vertically extending portion 34c of optical path 34a-e to image the output of light integrator 42 at the entrance pupil of an imaging lens 56. A slide 58 is mounted for movement along the Y axis under control of a Y axis servo drive unit 66 to selectively position either of two separate mask plates 60 and 62 at an operative position directly between positive lenses 46 and 47 in a horizontal plane orthogonally intersecting the vertically extending portion 34c of optical path 34a-e at a point midway between those positive lenses. Light appearing in this plane between positive lenses 46 and 47 is imaged onto reticle 12. When mask plate 62 is positioned in an operative position between positive lenses 46 and 47 a pair of small circular openings 68a and 68b of that mask plate permit the blue exposure light passed by blue filter 44 (or the green illuminating light passed by green filter 45, depending on the position of slide 52) to illuminate a corresponding pair of circular areas about 2 millimeters in diameter disposed on the surface of reticle 12 and containing a pair of reticle alignment marks 78a and 78b, respectively. However, when mask plate 60 is positioned in an operative position between positive lenses 46 and 47, a square central opening 69 of that mask plate permits illumination of an entire microcircuitry-containing central portion 160 of reticle 12.

Beam splitter 48 is fixedly mounted in the vertically extending portion 34c of optical path 34a-e so as to reflect eighty percent of the incident light along a horizontally extending portion 34d of that optical path through imaging lens 56 to a plane mirror 70. Imaging lens 56 is fixedly mounted along the horizontally extending portion 34d of optical path 34a-e and is employed to image the light passing through the selected mask plate 60 or 62 at the surface of reticle 12. Plane mirror 70 is fixedly mounted in optical path 34a-e at an angle of forty-five degrees with respect to the horizontally extending portion 34d thereof so as to deflect the light incident thereon downward along a vertically extending portion 34e of that optical path. This downwardly deflected light passes through a positive lens 72, reticle 12, and beam splitter 21 to projection lens 18. Positive lens 72 is fixedly mounted along the vertically extending portion 34e of optical path 34a-e so as to image light appearing at the output pupil of imaging lens 56 at the input pupil of projection lens 18.

An output end of a fiber optic light pipe 174 is fixedly mounted along a horizontally extending optical path 175 axially aligned with the horizontally extending portion 34d of optical path 34a-e. An input end of this fiber optic light pipe 174 is fixedly mounted adjacent to a blue filter at a corresponding opening in elliptical reflector 36. A beam of blue exposure light from mercury arc lamp 32 therefore passes through fiber optic light pipe 174 and along the horizontally extending optical path 175. A normally closed shutter 176 pivotally mounted adjacent to the horizontally extending optical path 175 is pivoted into that optical path (as shown in solid lines) when closed so as to block passage of the beam of light therealong and is pivoted out of that optical path (as shown in dashed lines) when opened so as to permit passage of the beam of light therealong. These pivotal movements of shutter 176 are controlled by a θ servo drive unit 177 coupled thereto.

The output end of fiber optic light pipe 174, the shutter 176, the θ servo drive unit 177, and a mask plate 182 are all mounted on a stage 178 for movement therewith along the X and Z axes. Stage 178 is moved along the X and Z axes by X and Z axes servo drive units 179 and 181 to selectively position mask plate 182 in a vertical plane orthogonally intersecting the horizontally extending optical path 175 at a point between fiber optic light pipe 174 and a positive lens 184. Mask plate 182 has a small circular opening 186 for permitting the beam of blue exposure light passing along the horizontally extending optical path 175, when shutter 176 is opened, to illuminate a corresponding circular area located on the reticle 12 and containing a small wafer alignment mark that may be on the reticle. Positive lens 184 is fixedly mounted in the horizontally extending optical path 175 so as to project light passing through the small circular opening 186 in mask plate 182 to the entrance pupil of imaging lens 56. Beam splitter 48 transmits twenty percent of the light passing through positive lens 184 forward along the horizontally extending portion 34d of optical path 34a-e. This light thereupon passes along the remainder of optical path 34a-e in the same manner as previously described.

With reference now particularly to FIGS. 1 and 3, each reticle 12 to be employed with alignment and exposure system 10 has a pair of oppositely-facing reticle alignment marks 78a and 78b spaced apart along the X axis when the reticle is properly aligned on stage 16. Each reticle alignment mark 78a or 78b may comprise a pair of light or transparent windows (each about 0.75 millimeters square) located on a dark or opaque field and symmetrically disposed about the center of the alignment mark on opposite sides of a pair of orthogonal centerlines of the alignment mark (one of those centerlines being coincident with a common centerline of both alignment marks). Stage 16 is provided with a vacuum holder 17 for releasably holding reticle 12 in plane, and is moved by X and differentially-controlled Y axes servo drive units 84, 86a, and 86b to adjust the X, Y, and θ orientation of the reticle as required to precisely align the reticle alignment marks 78a and 78b of the reticle with a reference mark aligned with the X axis as described in detail in copending U.S. patent application Ser. No. 026,722, entitled IMPROVED STEP-AND-REPEAT PROJECTION ALIGNMENT AND EXPOSURE SYSTEM, filed on Apr. 3, 1979, by Edward H. Phillips, assigned to the same assignee as the present application, and incorporated by reference herein (U.S. patent application Ser. No. 026,722 has been abandoned in favor of continuation U.S. patent application Ser. No. 396,099, filed on July 7, 1982).

Beam splitter 21 is mounted in the vertically extending portion 34e of optical path 34a-e so as to pass eighty percent of the light passing through reticle 12 to projection lens 18, which is also mounted in that portion of optical path 34a-e. A compensating lens (not shown) is pivotally mounted adjacent to projection lens 18 and controlled by a crank and an air cylinder for movement out of the vertically extending portion 34e of optical path 34a-e when blue light is passing therealong to the projection lens, as is normally the case, and for movement into the vertically extending portion 34e of that optical path when green light is passing therealong to the projection lens. The compensating lens is employed to compensate for the difference in wavelength of the green light and the blue light since projection lens 18 is corrected for the blue light only.

Projection lens 18 focuses light passing downward through beam splitter 21 (whether through reticle 12 or from compound microscope 22) at the first image plane 77 adjacent to main stage 20 and directly beneath the projection lens (in the case of light passing through reticle 12, this projects an image of the illuminated portions of the reticle onto semiconductive wafer 14 or whatever other object is positioned in image plane 77 directly beneath the projection lens. This illuminates any portions of the semiconductive wafer 14 positioned in the image plane 77 directly beneath projection lens 18. Twenty percent of the light reflected vertically upward from those illuminated portions of the semiconductive wafer 14 through projection lens 18 is reflected by beam splitter 21 along horizontally extending portions 87a of a dual optical path 87a-f to a second image plane 79 positioned the same optical distance from the beam splitter as is the reticle 12 and positioned between the beam splitter and objective lenses 88a and 88b of compound microscope 22. Projection lens 18 focuses this reflected light at the second image plane 79, thereby projecting an aerial image of those illuminated portions of the semiconcutive wafer 14 positioned in the first image plane 77 directly beneath the projection lens to the second image plane. Compound microscope 22 permits direct viewing of this aerial image and therefore direct alignment of the semiconductive wafer 14, thereby increasing the alignment accuracy of each level of microcircuitry photometrically printed on the semiconductive wafer. Wafer alignment marks 130a and 130b, such as crosses, may be printed on the semiconductive wafer 14 as shown and described in detail in the aforementioned U.S. patent application Ser. No. 026,722 and may be viewed by the compound microscope 22 while adjusting the position of main stage 20 and/or vacuum chuck 131 to facilitate the direct alignment of the semiconductive wafer relative to the reticle 14 prior to photometrically printing the level of microcircuitry contained on the reticle onto the semiconductive wafer.

Compound microscope 22 includes an objective lens unit mounted on a stage 96 horizontally movable along the X axis under control of an X axis servo drive unit 98 and vertically movable along the Z axis under control of a Z axis servo drive unit 100. Each of the objective lenses 88a and 88b of this objective lens unit comprises a 5:1 objective lens mounted on an associated arm 89, which is in turn pivotally mounted on stage 96 and coupled by a gear mechanism 102 to a θ servo drive unit 104 (both of which are also mounted on stage 96) for moving the objective lenses closer together or further apart. Objective lenses 88a and 88b are disposed along corresponding ones of the horizontally extending portions 87a of dual optical path 87a-f adjacent to the second image plane 79 for receiving light therefrom. Thus, the objective lenses 88a and 88b can be moved with respect to the second image plane 79 as desired for viewing any portions of the aerial image projected to that plane.

A separate beam bender 106 is mounted on each arm 89 along each horizontally extending portion 87a of dual optical path 87a-f for deflecting light passing through the corresponding objective lens 88a or 88b generally downward along a corresponding downwardly extending portion 87b of dual optical path 87a-f to a corresponding beam splitter 108. Each beam splitter 108 is mounted on the same arm 89 as the corresponding beam bender 106 for pivotal movement therewith as the objective lenses 88a and 88b are moved closer together or further apart. Beam splitters 108 are mounted along the corresponding downwardly extending portions 87b of dual optical path 87a-f for deflecting light from the corresponding beam benders 106 along corresponding horizontally extending portions 87c of dual optical path 87a-f to corresponding beam benders 110 from which that light is deflected along other corresponding horizontally extending portions 87c of dual optical path 87a-f to corresponding faces of a split field prism 112. Split field prism 112 in turn deflects light from each beam bender 110 in side-by-side relationship along a common horizontally extending portion 87c of dual optical path 87a-f through a field lens 114 to another beam bender 116. Beam benders 110, split field prism 112, and field lens 114 are fixedly mounted on stage 96 along the respective horizontally extending portions 87c of dual optical path 87a-f.

Beam bender 116 is mounted along the common horizontally extending portion 87c of dual optical path 87a-f for swivel movement thereabout and is disposed for deflecting light passing through field lens 114 downward along a downwardly extending portion 87d of that dual optical path through positive lenses 118 and 120 to a beam bender 122. Positive lenses 118 and 120 and beam bender 122 are mounted along the downwardly extending portion 87d of dual optical path 87a-f for swivel movement with beam bender 116 about the common horizontally extending portion 87e of that dual optical path, and to allow relative axial movement between positive lens 118 (which is fixedly mounted in a first tube 119 in fixed relation to beam bender 116) and positive lens 120 (which is fixedly mounted on a second tube 121 in fixed relation to beam bender 122, the first and second tubes 119 and 121 being slidably and coaxially disposed one within the other) as the length of the downwardly extending portion 87d of the dual optical path is changed by relative movement of beam benders 116 and 122. This accommodates movement of the objective lens unit mounted on stage 96 relative to a stationary binocular lens unit employed with the objective lens unit during precision alignment operations involving the reticle 12 and/or the semiconductive wafer 14. Beam bender 122 deflects light passing through positive lenses 118 and 120 forward along the horizontally extending portion 87e of dual optical path 87a-f to a beam bender 124 of the binocular lens unit. This beam bender 124 is fixedly mounted along the horizontally extending portion 87e of dual optical path 87a-f for deflecting light from beam bender 122 upward along a vertically extending portion 87f of dual optical path 87a-f to ocular lenses 126 of a binocular head 94, which is fixedly mounted along that portion of the dual optical path.

The various elements of the objective lens unit and the binocular lens unit are arranged along dual optical path 87a-f as described above so that the aerial image viewed in the second image plane 79 by objective lenses 88a and 88b is reimaged at a third image plane 113 directly in front of split field prism 112. Positive lens 118 is provided with a focal length equal to the distance back along dual optical path 87a-f to the third image plane 113, and positive lens 120 is provided with a focal length equal to the distance forward along that dual optical path to a fourth image plane 127 directly in front of ocular lenses 126. Positive lenses 118 and 120 therefore serve as a relay lens unit for reimaging the reimaged image appearing in the third image plane 113 at the fourth image plane 127 and for accommodating changes in the length of the downwardly extending portion 87d of dual optical path 87a-f while transmitting light passing between those positive lenses in parallel rays as required to maintain proper focus.

As shown in FIG. 3 and described in the aforementioned U.S. patent application Ser. No. 025,917, stage 16, beam splitter 21, and projectin lens 18 (and, hence, also the compensating lens) are securely mounted on a tower 2. This tower 2 comprises an upper platform 3 on which stage 16 and beam splitter 21 are mounted, six upright rods 4 on which the upper platform is securely mounted, and a base 5 on which the rods 4 and the projection lens 18 (and, hence, the compensating lens) are securely mounted. Stage 16, the reticle holder 17 mounted thereon, and the upper platform 3 of tower 2 are provided with clearance openings 6 permitting light passing through the reticle 12 to pass along the vertically extending portion 34e of dual optical path 34a-e through projection lens 18 to whatever object is positioned directly beneath the projection lens. The base 5 of tower 2 is mounted by airbearings on a casting 7, which is in turn fixedly mounted on a granite block 8 on which main stage 20 is mounted as described in the aforementioned U.S. patent application Ser. No. 015,713. Base 5 of tower 2 is vertically movable with respect to the casting 7 (and, hence, granite block 8) so as to permit vertical movement of the tower and, hence, projection lens 18 relative to main stage 20 under control of an automatic optical focusing system described in the aforementioned U.S. patent application Ser. No. 025,917. All of the elements of the objective lens unit and of the binocular lens unit are securely mounted on an upright portion 9 of casting 7. In addition, all of the elements of light source unit 24 shown in FIG. 2 are mounted on an upright post (not shown) which is in turn rotatably mounted on casting 7 so as to permit those elements to be pivoted away from the other portions of alignment and exposure system 10 for ease of service.

Figure 4:
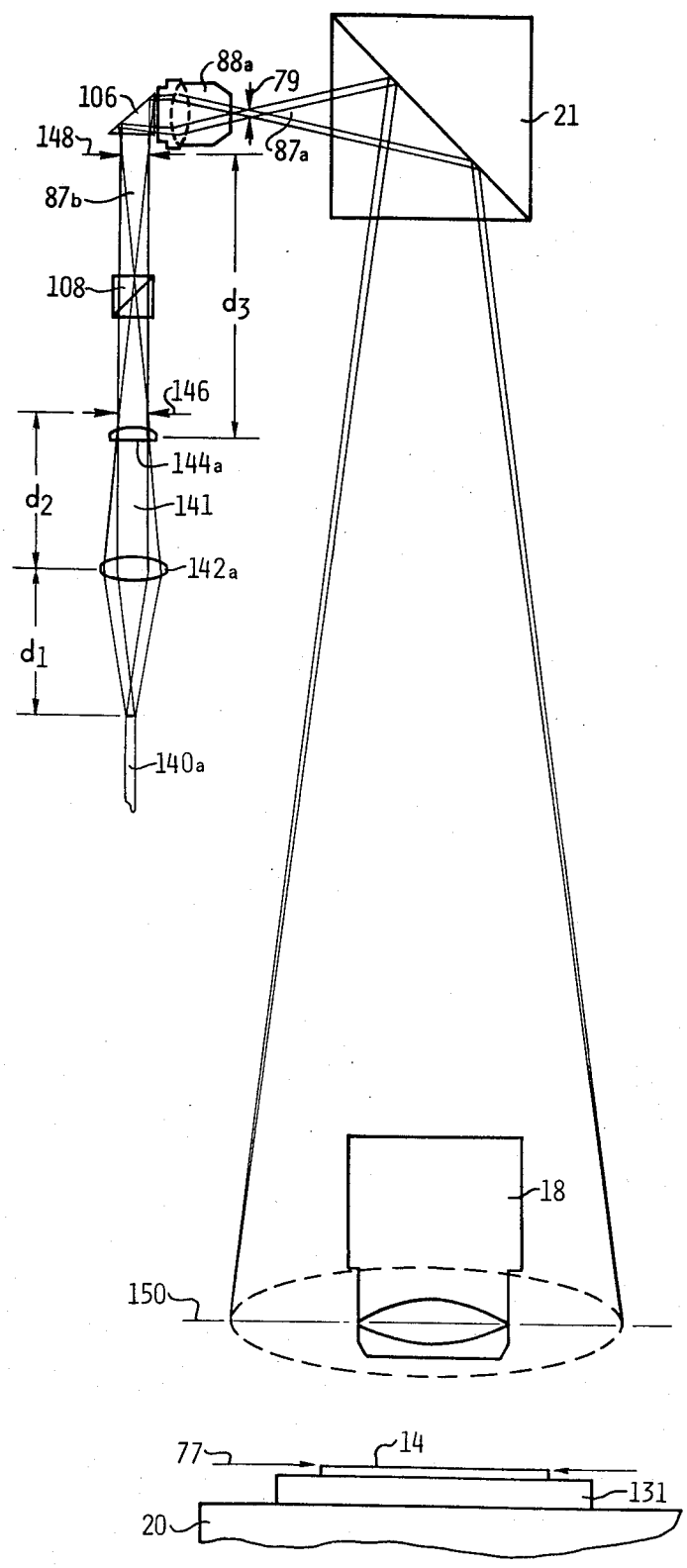
FIG. 4 is a schematic representation of the illumination system shown in FIGS. 1 and 3.

With reference now particularly to FIGS. 1, 3, and 4, a preferred embodiment of a frontal illumination system for uniformly illuminating the entire field of view of objective lenses 88a and 88b through projection lens 18 of alignment and exposure system 10 without passing the illuminating light through reticle 12 is disclosed. This frontal illumination system may be employed to advantage in precision wafer alignment operations performed by alignment and exposure system 10 and described in detail in the aforementioned U.S. patent application Ser. No. 026,772. It comprises a pair of fiber optic light sources 140a and 140b each formed by a different output end of the bifurcated fiber optic light pipe 41 of FIG. 2 and each associated with a corresponding different one of the objective lenses 88a and 88b of the objective lens unit of compound microscope 22. Since the input end of fiber optic light pipe 41 is uniformly illuminated by the green illuminating light passing through band pass filter 39 of FIG. 2, and since the fiber optic light pipe is provided with randomly positioned fibers, the fiber optic light sources 140a and 140b direct nominally uniform beams of light upward along corresponding vertically extending dual optical path portions 141 axially aligned with portions 87b of dual optical path 87a-f.

The frontal illumination system further comprises a pair of collector lenses 142a and 142b and a pair of field lenses 144a and 144b. Each of the collector lenses 142a and 142b is associated with a corresponding different one of the objective lenses 88a and 88b, is positioned an optical distance $d_1$ equal to the focal length of the collector lens from the output end of the corresponding fiber optic light source 140a or 140b, and is positioned an optical distance $d_2$ also equal to the focal length of the collector lens from a corresponding light source field stop 146. By making the optical distance $d_1$ equal to the focal length of each collector lens 42, telecentricity of the collected light is assured optimizing utilization of light from the light source. Each light source field stop 146 is located the same optical distance from the corresponding beam splitter 108 as is the apex of split field prism 112 such that uniform illumination of the light source field stop will result in uniform illumination at image plane 79 and, hence, at image plane 77 of alignment and exposure system 10. The diameter of each light source field stop 146 divided by the focal length of the corresponding collector lens 142a or 142b should be only slightly less than the conical angle of the light from the corresponding fiber optic light source 140a or 140b to make most efficient use of the light from the fiber optic light source.

Each of the field lenses 144a and 144b is also associated with a corresponding different one of the objective lenses 88a and 88b, is positioned as close as possible to (but not at) the light source field stop 146, and is positioned an optical distance $d_3$ equal to the focal length of the field lens from aperture plane 148 (this aperture plane happens to be the same plane in which an image of the entrance pupil of projection lens 18 is projected by beam splitter 21, objective lenses 88a and 88b, and beam benders 106). Fiber optic light source 140a, collector lens 142a, and field lens 144a are all fixedly mounted on the same arm 89 as the corresponding objective lens 88a for movement in place with that objective lens. Similarly fiber optic light source 140b, collector lens 142b, and field lens 144b are all mounted on the same arm 89 as the corresponding objective lens 88b for movement in place with that objective lens.

With the fiber optic light sources 140a and 140b, the collector lenses 142a and 142b, and the field lenses 144a and 144b positioned as shown and described herein, the light source field stop 146 and, hence, the image planes 79 and 77 are uniformly illuminated with green illuminating light that passes through the viewing optics of alignment and exposure system 10, but not through the reticle 12. A first image of each fiber optic light source 140a or 140b is projected to the aperture plane 148 from where it is reimaged into an enlarged second image of the fiber optic light source at the aperture plane 150 of the entrance pupil of projection lens 18, as shown by the principal rays illustrated in FIG. 4. The enlarged second image of eachh fiber optic light source 140a or 140b located at aperture plane 150 is sufficiently large to completely fill the entrance pupil of projection lens 18 for any position to which the corresponding object lens 88a or 88b may be moved by stage 96.

Figure 5:
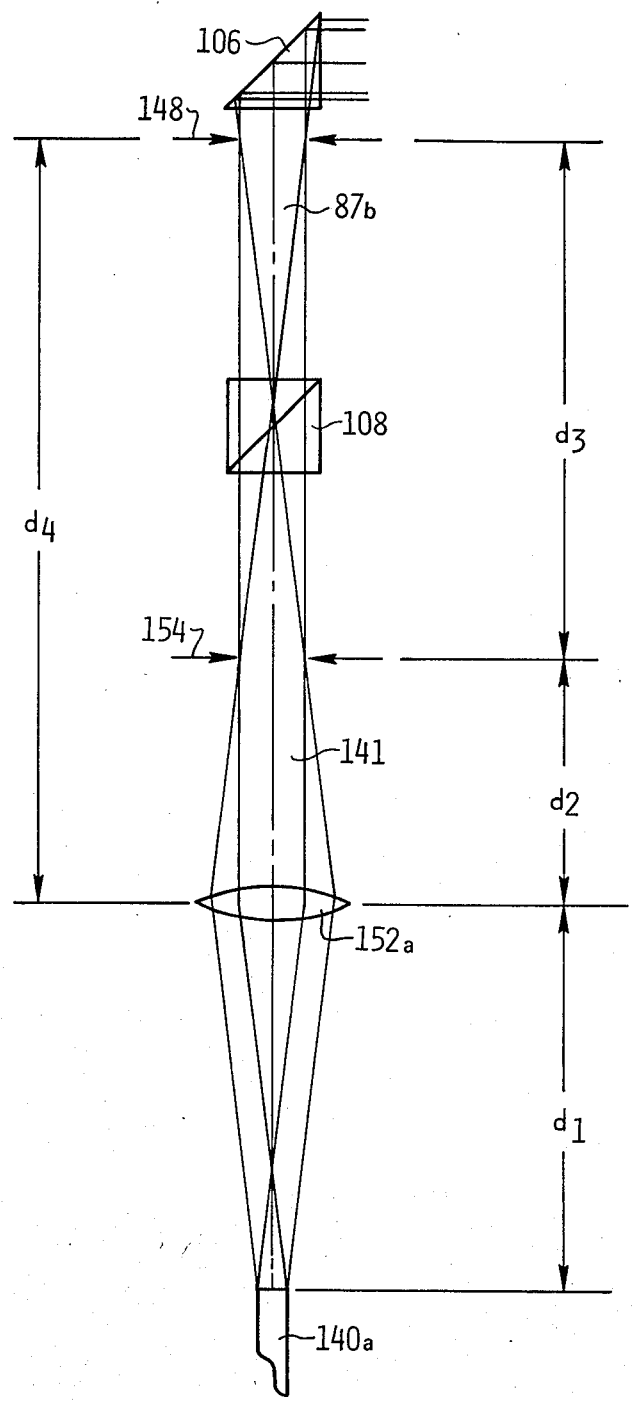
FIG. 5 is a schematic representation of an illumination system according to another preferred embodiment of this invention.

With reference now particularly to FIG. 5, another preferred embodiment of a frontal illumination system for uniformly illuminating the entire field of view of objective lenses 88a and 88b through projection lens 18 of alignment and exposure system 10 of FIG. 1 without passing light through reticle 12 is disclosed. This frontal illumination system employs a single pair of lenses 152 in place of the pair of collector lenses 142a and 142b and the pair of field lenses 144a and 144b of the embodiment of FIGS. 1, 3, and 4. Each of these lenses 152 is associated with a corresponding different one of the objective lenses 88a or 88b of FIGS. 1 and 3, is mounted on the same arm 89 as the corresponding objective lens for movement with that objective lens, is positioned an optical distance $d_1$ from a corresponding different one of the fiber optic light sources 140a or 140b, is positioned an optical distance $d_2$ from a corresponding light source field stop 154, and is positioned an optical distance $d_4$ from the aperture plane 148. The optical distances $d_1$, $d_2$, and $d_4$ may be determined from the following equations:

$$d_4/d_1 = M, \qquad (1)$$

$$d_1 d_2 = f_L, \qquad (2)$$

$$d_1 = f_L(1 + 1/M), \text{ and} \qquad (3)$$

$$d_4 = f_L(1 + M), \qquad (4)$$

where M equals the absolute value of the diameter of the aperture of aperture plane 148 divided by the absolute value of the diameter of the fiber optic light source, and where $f_L$ equals the focal length of each lens 152. Light source field stop 154 is positioned an optical distance $d_3$ from aperture plane 148. This optical distance $d_3$ may be determined from the following equation in conjunction with those given above:

$$d_3 = d_4 - d_2 \tag{5}$$

This embodiment of the frontal illumination system has the advantage of fewer optical parts at a penalty of some light loss due to a lack of telecentricity and, hence, not matching the conical angle of the light from the fiber optic light sources 142a and 142b as is accomplished by the embodiment of FIGS. 1, 3, and 4.

Figure 6:
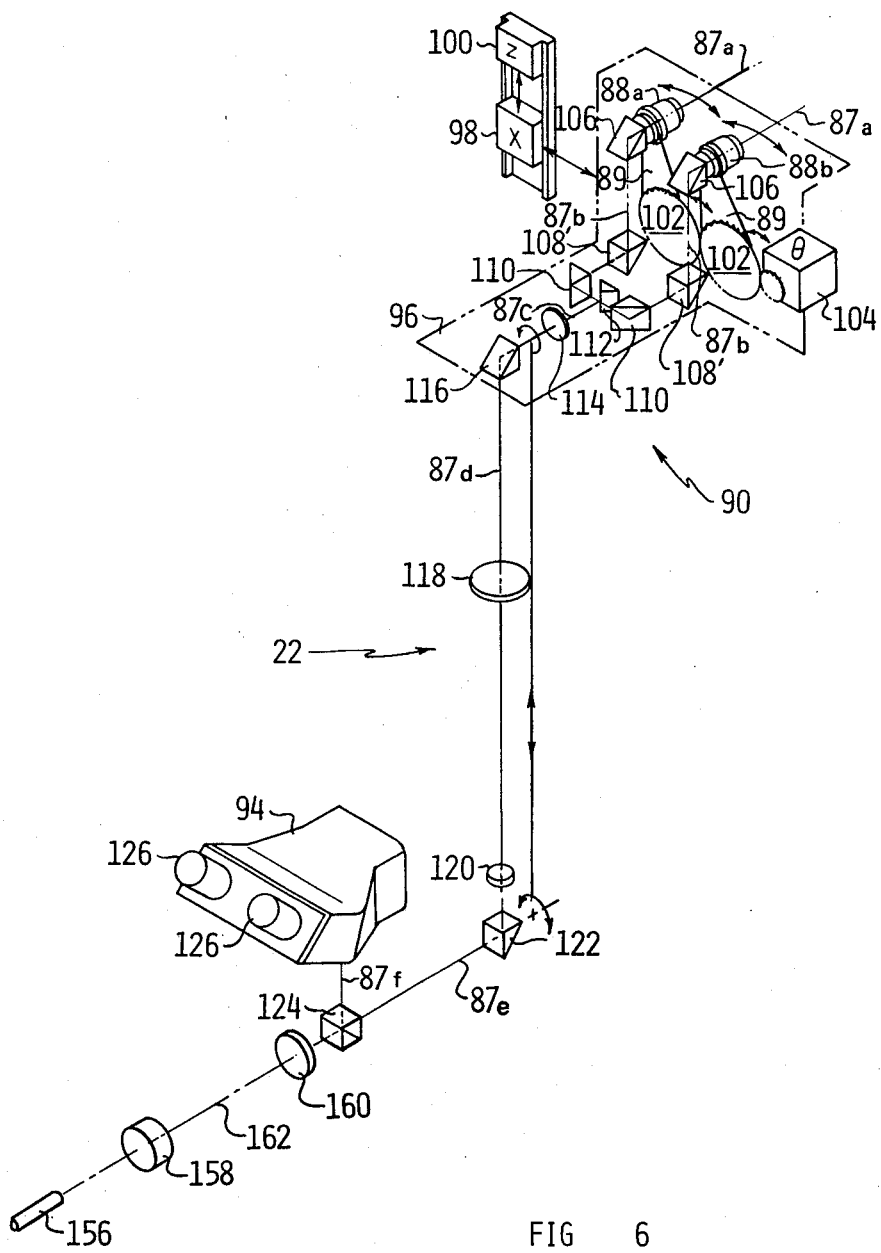
FIG. 6 is a perspective view of a portion of a step-and-repeat projection alignment and exposure apparatus incorporating an illumination system according to still another preferred embodiment of this invention.

With reference now particularly to FIG. 6, still another preferred embodiment of a frontal illumination system for uniformly illuminating the entire field of view of ocular lenses 126 through objective lenses 88a and 88b and projection lens 18 of alignment and exposure system 10 without passing the illuminating light through reticle 12 is disclosed. This frontal illumination system comprises a single fiber optic light source 156 of the same type as that described for the embodiment of FIGS. 1, 3, and 4, except that fiber optic light pipe 41 of FIG. 2 does not have to be bifurcated since only a single fiber optic light source 156 is employed. It further comprises a single collector lens 158 and a single field lens 160 both fixedly mounted with fiber optic light source 156 along an optical path 162 axially aligned with portion 87e of optical path 87a–f. Collector lens 158 is positioned at an optical distance equal to its focal length from the fiber optic light source 156. Field lens 160 is in turn selected and positioned to image fiber optic light source 156 at an appropriate position along portion 87e of optical path 87e–f where that image will be reimaged at aperture plane 148 shown in FIG. 4. It should be noted that the collector lens 158 and the field lens 160 may be replaced by a single lens in much the same manner as described in connection with FIG. 5. Whether a single lens or separate collector and field lenses 158 and 160 are employed, this embodiment of the frontal illumination system has the advantage of fewer optical parts, but has the disadvantage of more chance for glare since the illuminating light passes through more optics. It should also be noted that the optics of the compound microscope 22 are the same as previously described in connection with FIG. 1 except that beam splitters 108 are replaced by beam deflectors 108'.

I claim:

1. An optical system for illuminating a workpiece on which a pattern of a masking element is to be photometrically printed and for viewing an image of the illuminated workpiece, said system comprising:
   a first holder for holding the workpiece;
   a second holder for holding the masking element;
   refractive imaging means, disposed between the first and second holders, for projecting an image of the pattern of the masking element onto the workpiece and for projecting an image of an illuminated portion of the workpiece towards the second holder;
   first optical means, disposed between the refractive imaging means and the second holder, for providing a viewing port to facilitate viewing of the image of the illuminated portion of the workpiece;
   an objective lens unit including at least one objective lens, disposed adjacent to the viewing port, for viewing at least a portion of the image of the illuminated portion of the workpiece;
   light source means for providing a beam of illuminating light; and
   second optical means, disposed between the light source means and the objective lens and operable with the objective lens, for projecting an image of the light source means to an entrance pupil of the refractive imaging means without passing through the masking element.

2. An optical system as in claim 1 wherein:
   said first optical means includes first beam splitting means for directing light passing through the masking element towards the refractive imaging means and for directing light passing through the refractive imaging means for the workpiece towards the masking element; and
   said objective lens unit includes second beam splitting means, disposed between the second optical means and the objective lens, for directing light passing through the second optical means from the light source means towards the objective lens and for directing light passing through the objective lens from the viewing port towards another part of the objective lens unit.

3. An optical system as in claim 2 wherein said second optical means includes at least one lens, operable with the objective lens, for projecting an image of the light source means to the entrance pupil of the refractive imaging means.

4. An optical system as in claim 3 wherein said light source means comprises a fiber optic light source.

5. An optical system as in claim 2 wherein said second optical means includes a collector lens and a field lens, operable with the objective lens, for projecting an image of the light source means to the entrance pupil of the refractive imaging means.

6. An optical system as in claim 5 wherein:
   said field lens is disposed between the collector lens and the second beam splitting means; and
   said light source means comprises a fiber optic light source.

7. An optical system as in claim 1 wherein:
   said objective lens unit includes a pair of objective lenses, each of which is disposed adjacent to the viewing port for viewing at least a portion of the image of the illuminated portion of the workpiece;
   said light source means includes a pair of light sources, each of which is disposed for directing a beam of illuminating light towards a corresponding one of the objective lenses; and
   said second optical means includes a pair of lens means, each of which is disposed between a corresponding one of the light sources and a corresponding one of the objective lenses and is operable with the corresponding one of the objective lenses for projecting an image of the corresponding one of the light sources to the entrance pupil of the refractive imaging means.

8. An optical system as in claim 7 wherein:
   said first optical means includes first beam splitting means for directing light passing through the masking element towards the refractive imaging means and for directing light passing through the refractive imaging means for the workpiece towards the masking element; and said objective lens unit further includes a pair of second beam splitting means, each of which is disposed between a corresponding one of the lens means and a corresponding one of the objective lenses for directing light passing through the corresponding one of the lens means from the corresponding one of the light sources towards the corresponding one of the objective lenses and for directing light passing through the corresponding one of the objective lenses from the viewing port towards another part of the objective lens unit.

9. An optical system as in claim 8 wherein each of said lens means includes at least one lens, operable with the corresponding one of the objective lenses, for projecting an image of the corresponding one of the light sources to the entrance pupil of the refractive imaging means.

10. An optical system as in claim 9 wherein each of said light sources comprises a fiber optic light source.

11. An optical system as in claim 8 wherein each of said lens means includes a collector lens and a field lens, operable with the corresponding one of the objective lenses, for projecting an image of the corresponding one of the light sources to the entrance pupil of the refractive imaging means.

12. An optical system as in claim 11 wherein:
the field lens of each of said lens means is disposed between the corresponding collector lens and the corresponding one of the second beam splitting means; and
each of said light sources comprises a fiber optic light source.

13. An optical system as in claim 1 wherein:
said objective lens unit includes a pair of objective lenses, each of which is disposed adjacent to the viewing port for viewing at least a portion of the image of the illuminated portion of the workpiece;
said objective lens unit includes third optical means, disposed between the light source means and the objective lenses, for providing a split-field view of the portions of the image of the illuminated portion of the workpiece viewed by the objective lenses;
said first optical means includes first beam splitting means for directing light passing through the masking element towards the refractive imaging means and for directing light passing through the refractive imaging means from the workpiece towards the masking element;
said second optical means is disposed between the light source means and the third optical means and is operable with the third optical means and each of the objective lenses for projecting an image of the light source means to an entrance pupil of the refractive imaging means; and
said objective lens unit further includes second beam splitting means, disposed between the second optical means and the third optical means, for directing light passing through the second optical means from the light source means towards the third optical means and for directing light passing through the objective lenses and the third optical means from the viewing port towards another part of the objective lens unit.

14. An optical system as in claim 13 wherein said second optical means includes a collector lens and a field lens.

15. An optical system as in claim 14 wherein:
said field lens is disposed between the collector lens and the second beam splitting means; and
said light source means comprises a fiber optic light source.

16. An optical system as in claim 1 wherein said light source means and second optical means are operable with the objective lens for illuminating the entire field viewed on the workpiece by the objective lens through the refractive imaging means.

17. An optical system as in claim 1 wherein said refractive imaging means comprises a refractive projection lens of the reduction type.

18. An optical system as in claim 17 wherein said light source means and second optical means are operable with the objective lens for uniformly illuminating the entire field viewed on the workpiece by the objective lens through the refractive projection lens.

19. An optical system as in claim 18 wherein said light source means comprises a fiber optic light source.

* * * * *